United States Patent [19]
Koikari et al.

[11] Patent Number: 5,850,083
[45] Date of Patent: Dec. 15, 1998

[54] CHARGED PARTICLE BEAM LITHOGRAPH APPARATUS

[75] Inventors: Souji Koikari, Numazu; Shuichi Tamamushi, Kawasaki; Shusuke Yoshitake, Yokohama; Munehiro Ogasawara, Fujisawa, all of Japan

[73] Assignee: Kabushiki Kaisha Toshiba, Kawasaki, Japan

[21] Appl. No.: 821,303

[22] Filed: Mar. 20, 1997

[30] Foreign Application Priority Data

Mar. 25, 1996 [JP] Japan ................................ 8-068789

[51] Int. Cl.⁶ .................................................. H01J 37/145
[52] U.S. Cl. ............................. 250/396 R; 250/396 ML; 250/492.2
[58] Field of Search ........................ 250/396 R, 396 ML, 250/398, 492.2

[56] References Cited

U.S. PATENT DOCUMENTS

| | | | |
|---|---|---|---|
| 4,101,813 | 7/1978 | Parker et al. | |
| 4,137,459 | 1/1979 | Albrecht et al. | |
| 4,362,942 | 12/1982 | Yasuda | 250/398 |
| 4,438,336 | 3/1984 | Riecke | 250/398 |
| 5,304,811 | 4/1994 | Yamada et al. | 250/398 |
| 5,412,277 | 5/1995 | Chen | 313/414 |
| 5,610,475 | 3/1997 | Chen | 313/414 |
| 5,635,719 | 6/1997 | Petric | 250/396 ML |
| 5,757,010 | 5/1998 | Langner | 250/396 ML |

OTHER PUBLICATIONS

Hajime Ohiwa, "Moving Objective Lens and the Fraunhofer Condition for Pre–deflection", OPTIK, vol. 53, No. 1, 1979, pp. 63–68.

Teruo Hosokawa, "Systematic Elimination of Third Order Aberrations in Electron Beam Scanning System", OPTIK, vol. 56, No. 1, 1980, pp. 21–30.

*Primary Examiner*—Bruce Anderson
*Attorney, Agent, or Firm*—Oblon, Spivak, McClelland, Maier & Neustadt, P.C.

[57] ABSTRACT

A charged particle beam lithograph apparatus of the present invention projects a charged particle beam onto a sample through a mask and lithographs a mask pattern on the sample through the movement of the charged particle beam. In order to focus the charged particle beam, the apparatus creates an electromagnetic field, from the magnetic lens, symmetric with respect to an optical axis of the charged particle beam. An aberration of the charged particle beam is created under the symmetric electromagnetic magnet. The aberration is compensated for under an electromagnetic field nonsymmetric with respect to the optical axis which is created by a deflection unit.

24 Claims, 3 Drawing Sheets

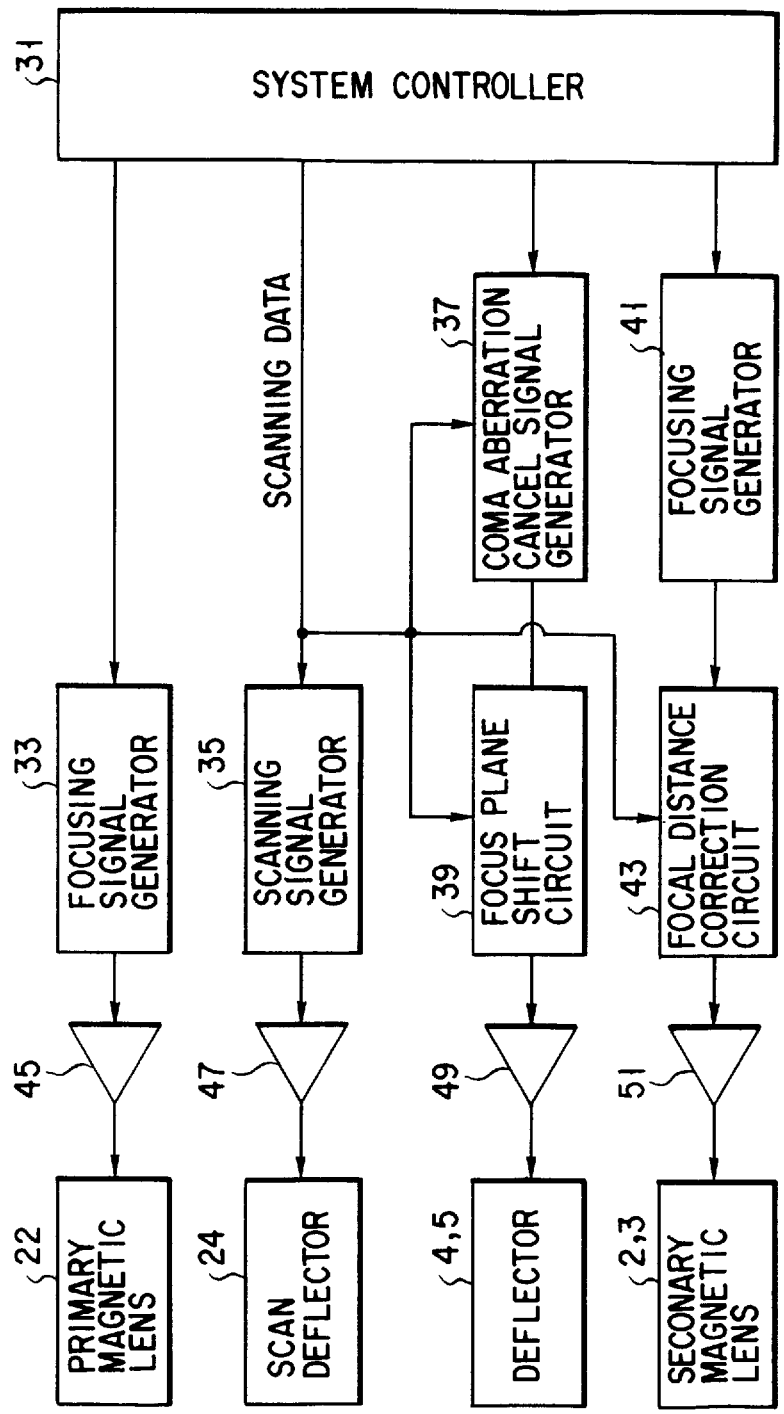
F I G. 2

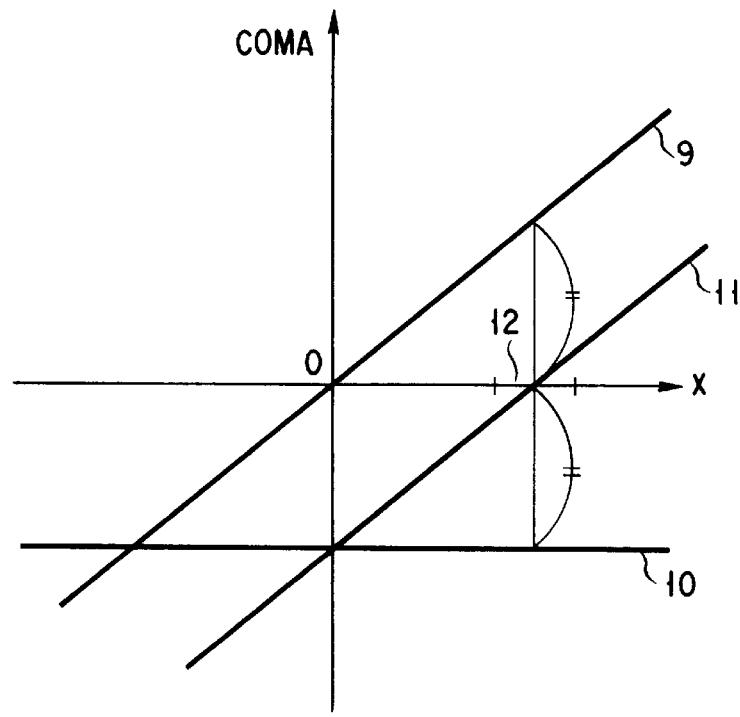
F I G. 3
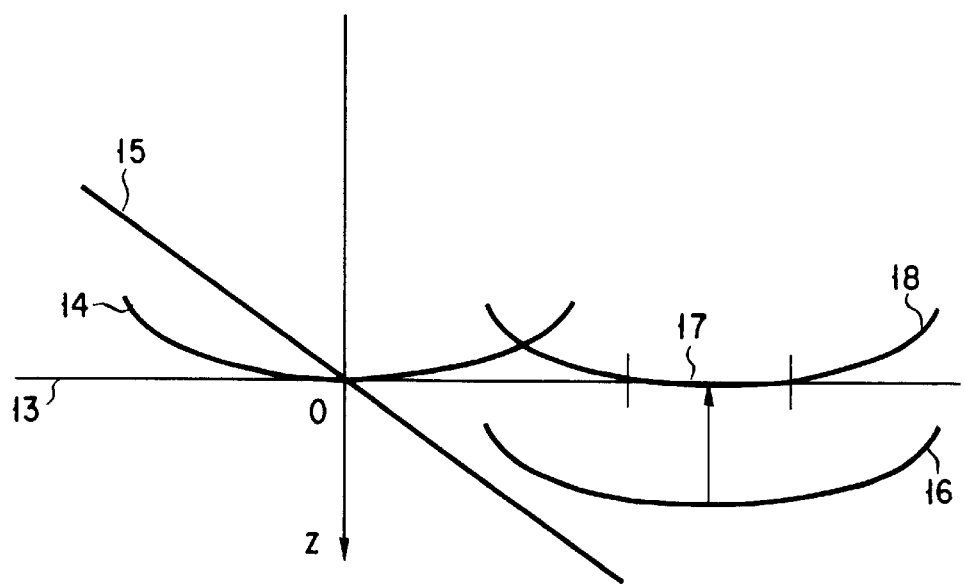
F I G. 4

CHARGED PARTICLE BEAM LITHOGRAPH APPARATUS

BACKGROUND OF THE INVENTION

The present invention relates to an apparatus for projecting a charged particle beam, such as an electron or ion beam, onto a sample through a mask and, in particular, to a charged particle beam lithograph apparatus for lithographing a mask pattern on a sample by moving such a beam.

This type of apparatus is equipped with an optical system for focusing or deflecting a beam. The focusing is done by an axisymmetric electromagnetic field created by a magnetic lens, electrostatic lens, etc., and the deflection is effected by controlling non-symmetry in an electromagnetic field.

Such an optical system presents an aberration problem. The aberration handling method is, for example, (1) by curving a mask or (2) by varying the intensity of an electromagnetic field by an electrostatic lens and hence a focal distance involved and utilizing only a crosspoint between a focus plane and a sample surface which is created by moving the focus plane up and down.

However, these methods (1) and (2) are effective to a curvature aberration caused by a curved focal plane involved, but cannot eliminate, for example, a coma aberration.

The former method (1) cannot be applied to the case where the mask cannot be curved, while, on the other hand, the latter method (2) presents the problem in that the inclination of the focus plane is made greater, as the distance is moved away from an optical axis, with the consequent lowered production efficiency.

BRIEF SUMMARY OF THE INVENTION

It is accordingly the object of the present invention to provide a charged particle beam lithograph apparatus which can effectively compensate for the aberration of a charged particle beam resulting from a symmetric electromagnetic field, such as a coma aberration and curvature aberration.

A charged particle beam lithograph apparatus of the present invention lithographs a mask pattern onto a sample through the projection of a charged particle beam onto a sample through a mask and the movement of the charged particle beam. In order to focus the charged particle beam, an electromagnetic field is defined, by a magnetic lens, symmetric with respect to an optical axis. An aberration of the charged particle beam is produced under this symmetric electromagnetic field and it is compensated for under an electromagnetic field nonsymmetric with respect to the optical axis which is defined by the deflection unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram showing a major arrangement of a charged particle beam lithograph apparatus according to the embodiment of the present invention;

FIG. 3 is a "principle" explanation view for canceling a coma aberration by a secondary magnetic lens in FIG. 1 with a coma aberration by a secondary deflection unit; and FIG. 4 is a model view showing the shifting of a focus plane to prevent minimization of a beam spot resulting from a curvature aberration in the present embodiment.

DETAILED DESCRIPTION OF THE INVENTION

Figure 1:
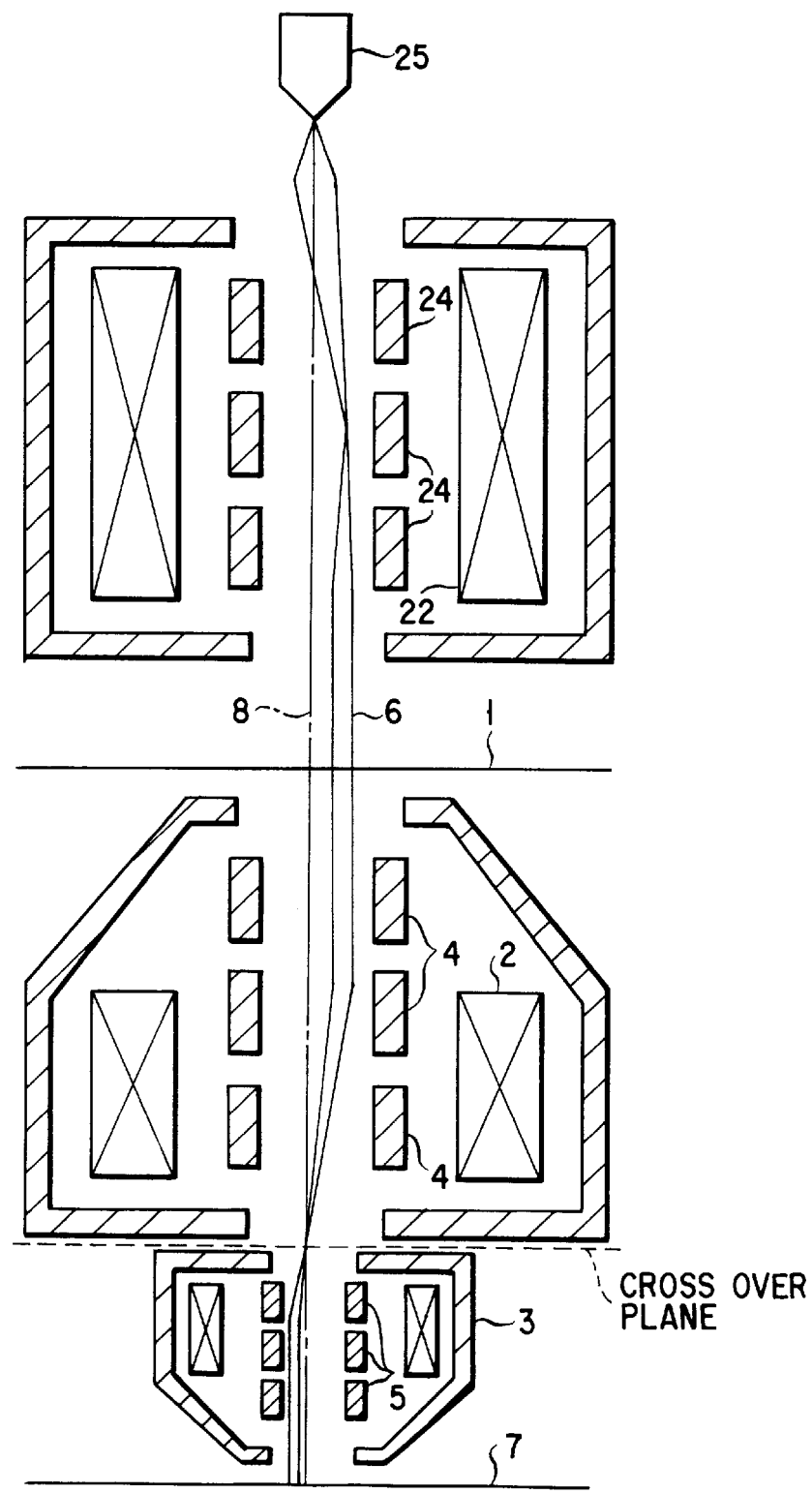
FIG. 1 is a longitudinal view showing a column of a charged particle beam lithograph apparatus according to one embodiment of the present invention.

A charged particle beam lithograph apparatus of the present invention will be explained below with reference to a preferred embodiment. Here, explanation is given below, by way of example, about a charged particle beam lithograph apparatus for projecting a charged particle beam, such as an electron beam or ion beam, past a very fine pattern mask onto a sample, transferring the beam and lithographing the pattern on the sample.

FIG. 1 is a cross-sectional view showing a column of a charged particle beam lithograph apparatus according to one embodiment of the present invention. A beam 6 generated from an electron gun 25 illuminates a mask 1 past an electromagnetic field symmetric to an optical beam 8 which is produced by a primary magnetic lens 22 and an electromagnetic field nonsymmetric to the optical axis 8 which is produced by a scanning deflection unit (deflector) 24. Any given LSI pattern is written at a time or cyclically on a mask 1.

The beam shaped at the mask 1 is imaged on the sample 7 past an electromagnetic field symmetric to the optical axis 8 which is defined by secondary magnetic lenses 2, 3 and an electromagnetic field nonsymmetric to the optical axis 8 which is defined by deflection units (deflectors) 4, 5. The deflection units 4, 5, each, comprise three deflection coils arranged parallel to the optical axis 8.

It is possible to write the pattern of the mask 1 on the sample 7 by controlling the nonsymmetry of the electromagnetic field by the scanning deflection unit 24.

By dynamically controlling the nonsymmetry of the electromagnetic field defined by the deflection units 4, 5 in accordance with the position of the beam on the mask 1, that is, with the use of a coma aberration intentionally produced by the deflectors, the coma aberration resulting from the magnetic lenses 2, 3 is canceled. That is, a total of the coma aberration resulting from the magnetic lenses 2, 3 and coma aberration resulting from the deflection units 4, 5 is set, at all times, to be zero or a very small level at a sample surface. If, at this time, the deflection sensitivity is set to be zero, the characteristic becomes equal to an axial imaging characteristic in the case of those axisymmetric magnetic lenses 2, 3 only being involved.

In the case where a position in a focus plane varies by the deflection units 4, 5 in the magnetic field, it is only necessary to variably control a drive current also in the magnetic lenses 2, 3 in accordance with the control of the deflection units 4, 5. Further, a mask stage with the mask 1 placed thereon and sample stage with the sample placed thereon, that is, with the sample on which the pattern on the mask 1 is projected, are synchronously driven/controlled so as to enable their speed ratio to be set equal to a magnification of an electronic beam optical system.

If, on the other hand, the mask 1 has a pattern 1 of cyclic holes, the same control as that on a conventional variable shaping beam exposure apparatus is carried out. In the conventional variable shaping beam exposure apparatus, a rectangular beam which is shaped on a first aperture is shaped by a second aperture into a rectangular or triangular beam of any size. At this time, a single opening was formed, normally on the optical axis, in the first and second apertures and a shaped beam was projected, under a deflection unit, on a projection plane at any given position. In order to secure a broader illumination area, this system has required, as a power supply for the deflection unit, a DA converter for more bits and a high speed amplifier of a greater amplification factor.

If, with the use of an aperture mask with openings of the same size cyclically arranged as the mask 1, they are selectively used in accordance with a position on the projection plane, it is possible to project a shaped beam of a given pattern in a broader range. It is, therefore, possible to illuminate a relatively broader area even with the use of a DA converter of less bits and amplifier of a smaller amplification factor. At this time, since an area greatly distant from the optical axis can be used relative to the aperture mask, the aberration of the lens becomes greater in the conventional structure, so that a given pattern cannot be printed with a better image resolution. According to the aberration correction method of the present invention, on the other hand, it is possible to solve this problem encountered in the conventional structure.

According to the present invention, as set out above, the coma aberration of the above-mentioned electromagnetic lenses 2, 3 is dynamically canceled by the coma aberration of the magnetic lenses 2, 3 and it is possible to perform a lithograph process without a beam spot being minimized due to a curvature aberration caused by the optical system involved.

FIG. 2 shows an arrangement of a major section for realizing these features. The major section is so arranged that a system controller 31 serves as a control center. In this arrangement, a focusing signal generator 33 generates a focusing signal in accordance with a control signal from the system controller 31. The focusing signal is amplified by an amplifier 45 and supplied to the primary magnetic lens 22. The scanning signal generator 35 generates a scanning signal in accordance with a scanning control signal from the system controller 31. The scanning signal is amplified by an amplifier 47 and supplied to a scan deflector (deflection unit) 24.

A coma aberration cancel signal generator 37 takes in the scan control signal and a coma aberration cancel signal is dynamically generated in accordance with a position on the mask 1 represented by this signal. A deflection magnetic field is created by the coma aberration cancel signal from the deflection unit (deflectors 3, 4) and the coma aberration of the magnetic lenses 2, 3 is dynamically canceled by the coma aberration intentionally produced through the deflection.

A focus plane shift circuit 39 takes in a scanning control signal and a shift signal for shifting sideways (the orthogonal direction for the optical axis) a focus plane is dynamically formed in accordance with a position on the mask 1 represented by that signal and added to the coma aberration cancel signal. The addition signal is supplied to the deflection units (deflectors 4, 5).

A focusing signal generator 41 generates a focusing signal in accordance with a control signal from the system controller 31. A focusing distance correcting circuit 43 takes in the scanning control signal and the focal distance of the focusing signal from the focusing signal generator 41 is dynamically corrected (varied) in accordance with a position on the mask 1 represented by this signal. The corrected focusing signal is amplified by the amplifier 51 and supplied to the secondary magnetic lenses 2, 3.

By the shifting of the focus plane and correction of the focal distance it is possible to effect a lithograph process by a bottom portion of a beam focus plane curved by the curvature aberration, that is, by the effective greatest portion of a beam spot.

First, the canceling of the coma aberration will be explained below. FIG. 3 shows the positional dependency of the coma aberration by the magnetic lenses 2 and 3. A line 9 represents a coma aberration by the magnetic lenses 2 and 3 and a line 10 represents a coma aberration produced by the deflection units 4 and 5. The sum of both the coma aberrations is represented by a line 11. For example, when a beam is on a position 12 on the mask 1, the coma aberration is so created by the deflection units 4, 5 as to set the sum of coma aberration to be zero at that position 12. This is represented by the following equation. With L representing the distance from the optical axis of a charged particle beam and A, the convergence semiangle, the coma aberration by the axisymmetric lens becomes $L \cdot A^2$, while, on the other hand, the coma aberration by the deflection units 4, 5 becomes $D \cdot A^2$ where the strength of the deflection magnetic field is represented by D. If, therefore, L takes any given value $L_0$, $$L \cdot A^2 + D \cdot A^2 = (L+D) \cdot A^2 = (L_0 - L_0) \cdot A^2$$

where $D = -L_0$, and the coma aberration by the magnetic lenses 2, 3 and that by the deflection units 4, 5 cancel each other.

In the case where the charged particle beam illuminates an area near the position 12, a deflection coma aberration as at the line 10 is produced by the deflection units 4, 5, whereby the coma aberration is canceled. By adjusting a drive force (drive voltage, drive current) of the deflection units 4, 5 by a coma aberration cancel signal in synchronization with the scanning of the charged particle beam and controlling the deflection coma aberration it is possible to dynamically remove the coma aberration of the magnetic lenses 2, 3 varying in accordance with the scanning position.

Explanation will be given about preventing the minimization of the beam spot by the curvature aberration. FIG. 4 shows the pattern of the focusing plane near the surface of a sample 7. The line 13 shows a sample surface on which a mask pattern is to be projected and the curve 14 shows a focus plane curved due to the curvature aberration by the magnetic lenses 2, 3. A deflection electromagnetic field 15 created by a shift signal under the deflection units 4, 5 have its focus plane 14 shifted to a position of a curve 16.

When the focal distance of the magnetic lenses 2, 3 is varied by a focusing signal whose focal distance is corrected, the focal plane is moved to a position of a curve 18 where a bottom portion of the curved beam focus plane 18 is set in contact with the sample surface 13 at a position 17. The bottom portion of the curved beam focus plane is relatively flattened and it is, therefore, possible to effect a lithograph process, with a great spot, at and near the position 17.

In order to eliminate the coma aberration or shift the focus plane, the deflection units 4, 5 are so controlled as to have a sum of their deflection amounts set to be substantially zero at the focus plane (or the sample surface). By doing so, it is possible to eliminate only the aberration without varying the basic characteristics of the focusing by the magnetic lenses 2, 3. For this purpose, requisite information is supplied from the system controller 31 to the coma aberration cancel signal generator 37. With this information additively combined, the coma aberration cancel signal generator 37 generates a coma aberration cancel signal.

Although, irrespective of the movement of the charged particle beam, the beam is focused on the same plane, when control is so made as to allow a deflection amount to be set to be zero at a crossover plane, it is possible to control the convergence semi-angle of the charged particle beam with an aperture of a circular opening set relative to the crossover plane. For this reason, the requisite information is supplied from the system controller 31 to the coma aberration cancel signal generator 37 and the coma aberration cancel signal is produced, with the information additively combined, from the coma aberration cancel According to the present embodiment as set out in detail above, it is possible to, by dynamically producing the deflection coma aberration in accordance with the position of the charged particle beam illuminated on the mask, dynamically cancel the coma aberration by the magnetic lens varying in accordance with that position. By dynamically shifting the focus plane, by deflection, in accordance with the position of the charged particle beam illuminated on the mask and varying the focal distance of the lens, it is possible to perform the lithograph process with a great beam spot and improve the production efficiency.

The present invention is not restricted to the above-mentioned embodiment. In the present embodiment, the arrangement of the optical system is not restricted thereto and may be properly modified in accordance with its specification. Further, the lens may be not only of an magnetic type but also of an electrostatic type. The deflection unit may be comprised of not only an electrostatic deflection unit but also magnetic deflection unit. The present invention is not restricted to the lithograph apparatus only and can also be applied to an apparatus for projection-focusing a mask image on the sample surface with an electron beam or ion beam.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A charged particle beam lithograph apparatus for lithographing a pattern of a mask onto a sample through the projection of the charged particle beam onto the sample through the mask and the movement of the charged particle beam, comprising:
   a magnetic lens;
   a first drive circuit for driving the magnetic lens to create an electromagnetic field symmetric with respect to an optical axis of the charged particle beam;
   a deflection unit; and
   a second drive circuit for driving the deflection unit to create an electromagnetic field nonsymmetric with respect to the optical axis and compensate for an aberration of the charged particle beam resulting from the symmetric electromagnetic field.

2. The apparatus according to claim 1, wherein the second drive circuit includes a circuit for dynamically varying the nonsymmetric electromagnetic field with a movement of the charged particle beam.

3. The apparatus according to claim 1, wherein the second drive circuit includes a circuit for generating a deflection coma aberration by the nonsymmetric electromagnetic field so as to cancel the coma aberration resulting from the symmetric electromagnetic field.

4. The apparatus according to claim 3, wherein the second drive circuit includes a circuit for dynamically varying the deflection aberration with a movement of the charged particle beam.

5. The apparatus according to claim 1, wherein the first drive circuit has a circuit for correcting a focal distance of the electromagnetic lens and the second drive circuit has a circuit for shifting the charged particle beam under the nonsymmetric electromagnetic field, wherein, through the correction and shifting, a bottom portion of a focus plane by the charged particle beam which is curved by a curvature aberration is set, as a beam spot, on the sample at any given position.

6. The apparatus according to claim 5, wherein the first drive circuit includes a circuit for dynamically varying a correction amount of the focal distance with the movement of the charged particle beam and the second drive circuit includes a circuit for dynamically varying a shift amount of the charged particle beam with the movement of the charged particle beam.

7. The apparatus according to claim 1, wherein the second drive circuit includes a circuit for setting a deflection amount of the charged particle beam on the focus plane to be substantially zero.

8. The apparatus according to claim 1, wherein the second drive circuit includes a circuit for setting a deflection amount of the charged particle beam to be substantially zero at a crossover plane where deflection beams intersect.

9. The apparatus accordion to claim 1, where, in place of a magnetic lens, use is made of an electrostatic lens.

10. The apparatus according to claim 1, wherein the deflection unit is comprised of a magnetic deflection unit or electrostatic deflection unit.

11. The apparatus according to claim 1, wherein the mask has an aperture pattern corresponding to an LSI pattern.

12. The apparatus according to claim 1, wherein the mask has an aperture pattern with a cyclic array of identical holes provided therein.

13. A charged particle beam lithograph apparatus for lithographing a pattern of a mask onto a sample through the projection of the charged particle beam onto the sample through the mask and the movement of the charged particle beam, comprising:
   means for creating an electromagnetic field symmetric with respect to an optical axis of the charged particle beam so as to focus the charged particle beam;
   means for creating an electromagnetic field nonsymmetric with respect to the optical axis; and
   compensating means for allowing the nonsymmetric electromagnetic field to be created in a way to compensate for an aberration of the charged particle beam resulting from the symmetric electromagnetic field.

14. The apparatus according to claim 13, wherein the compensating means includes means for dynamically varying the nonsymmetric electromagnetic field with a movement of the charged particle beam.

15. The apparatus according to claim 13, wherein the compensating means includes means for creating a deflection coma aberration under the nonsymmetric electromagnetic field so as to cancel a coma aberration resulting from the symmetric electromagnetic field.

16. The apparatus according to claim 15, wherein the compensating means includes means for dynamically varying the deflection coma aberration with a movement of the charged particle beam.

17. The apparatus according to claim 13, wherein the compensating means has means for correcting a focal distance of the charged particle beam and means for shifting the charged particle beam under the nonsymmetric magnetic field, wherein, through the correction and shifting, a bottom portion of a focus plane by the charged particle beam which is curved by a curvature aberration is set, as a beam spot, on the sample at any given position.

18. The apparatus according to claim 17, wherein the compensating means includes means for dynamically varying a correction amount of the focal distance with a movement of the charged particle beam and means for dynamically varying a shift amount of the charged particle beam with a movement of the charged particle beam.

19. The apparatus according to claim 13, wherein the compensating means includes means for setting a deflection amount of the charged particle beam to be substantially zero on a sample surface.

20. The apparatus according to claim 13, wherein the compensating means includes means for setting a deflection amount of the charged particle beam to be substantially zero at a crossover plane where deflected charged particle beams intersect.

21. The apparatus accordion to claim 13, wherein the means for creating an electromagnetic field symmetric with respect to an optical axis has an electromagnetic deflection unit or electrostatic deflection unit.

22. The apparatus accordion to claim 13, wherein the means for creating an electric magnetic field nonsymmetric with respect to the optical axis has an electromagnetic deflection unit or electrostatic deflection unit.

23. The apparatus according to claim 13, wherein the mask has an aperture pattern corresponding to an LSI pattern.

24. The apparatus according to claim 13, wherein the mask has an aperture pattern with a cyclic array of identical holes provided therein.

* * * * *